United States Patent
Park et al.

(10) Patent No.: US 9,142,153 B2
(45) Date of Patent: Sep. 22, 2015

(54) TWO SIDE DISPLAY DEVICE AND MANUFACTURING METHOD THEREOF

(71) Applicant: SAMSUNG DISPLAY CO., LTD., Yongin, Gyeonggi-do (KR)

(72) Inventors: Jin-Oh Park, Yongin (KR); Dong-Wan Choi, Yongin (KR); Hyo-Sang Yang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 286 days.

(21) Appl. No.: 13/789,530

(22) Filed: Mar. 7, 2013

(65) Prior Publication Data

US 2014/0118221 A1    May 1, 2014

(30) Foreign Application Priority Data

Oct. 25, 2012  (KR) .................. 10-2012-0119159

(51) Int. Cl.
*G09G 3/20*    (2006.01)
*G06F 3/14*    (2006.01)

(52) U.S. Cl.
CPC ............ *G09G 3/20* (2013.01); *G06F 3/1431* (2013.01); *G09G 2300/023* (2013.01); *Y10T 29/49826* (2015.01)

(58) Field of Classification Search
USPC ....................................................... 345/1.3
See application file for complete search history.

(56) References Cited

U.S. PATENT DOCUMENTS

| | | | | |
|---|---|---|---|---|
| 8,330,900 B2* | 12/2012 | Kuo et al. | ............... | 349/73 |
| 9,007,277 B2* | 4/2015 | Fleck | ................. | 345/1.1 |
| 2003/0227441 A1* | 12/2003 | Hioki et al. | ............ | 345/156 |
| 2004/0075628 A1* | 4/2004 | Chien et al. | ............ | 345/82 |
| 2004/0207569 A1* | 10/2004 | Ho et al. | ................. | 345/1.1 |
| 2005/0024319 A1* | 2/2005 | Amirzadeh et al. | ... | 345/104 |
| 2005/0052342 A1* | 3/2005 | Wu et al. | ................. | 345/4 |
| 2005/0253778 A1* | 11/2005 | Ku et al. | ................ | 345/1.3 |
| 2006/0038740 A1* | 2/2006 | Jung et al. | ............. | 345/1.1 |
| 2006/0092095 A1* | 5/2006 | Ming-Daw et al. | .... | 345/1.3 |
| 2007/0126654 A1* | 6/2007 | Choi et al. | ............. | 345/1.1 |
| 2007/0126971 A1* | 6/2007 | Lo | ........................ | 349/149 |
| 2007/0285413 A1* | 12/2007 | Wong et al. | ........... | 345/211 |
| 2010/0064244 A1* | 3/2010 | Kilpatrick et al. | ..... | 715/773 |

(Continued)

FOREIGN PATENT DOCUMENTS

KR   10-2005-0036230 A   4/2005
KR   10-2007-0098225 A   10/2007

(Continued)

*Primary Examiner* — Antonio Xavier
(74) *Attorney, Agent, or Firm* — Christie, Parker & Hale, LLP

(57) ABSTRACT

A two side display device includes: a flexible substrate including a first substrate part, a second substrate part under the first substrate part, and a bending part coupling the first substrate part to the second substrate part; a first display panel on the first substrate part and configured to display a first image in a first direction; a second display panel under the second substrate part and configured to display a second image in a second direction opposite the first direction; and a driving chip coupled to the first substrate part.

According to exemplary embodiments, first and second display panels are positioned on the same surface of a flexible substrate and configured to display images in opposing directions by bending the flexible substrate, which may reduce the thickness and manufacturing cost of the two side display device.

12 Claims, 7 Drawing Sheets

(56) References Cited

U.S. PATENT DOCUMENTS

| | | | |
|---|---|---|---|
| 2010/0188422 A1* | 7/2010 | Shingai et al. | 345/647 |
| 2010/0277443 A1* | 11/2010 | Yamazaki et al. | 345/204 |
| 2010/0321275 A1* | 12/2010 | Hinckley et al. | 345/1.3 |
| 2011/0134087 A1* | 6/2011 | Moriwaki | 345/204 |
| 2011/0134144 A1* | 6/2011 | Moriwaki | 345/660 |
| 2012/0098774 A1* | 4/2012 | Abe et al. | 345/173 |
| 2012/0274575 A1* | 11/2012 | Solomon et al. | 345/173 |
| 2013/0286462 A1* | 10/2013 | Yeo et al. | 359/291 |
| 2014/0049449 A1* | 2/2014 | Park et al. | 345/1.3 |
| 2014/0098028 A1* | 4/2014 | Kwak et al. | 345/173 |

FOREIGN PATENT DOCUMENTS

| | | |
|---|---|---|
| KR | 10-2012-0050171 A | 5/2012 |
| KR | 10-2012-0053340 A | 5/2012 |

* cited by examiner

TWO SIDE DISPLAY DEVICE AND MANUFACTURING METHOD THEREOF

CROSS-REFERENCE TO RELATED APPLICATION

This application claims priority to and the benefit of Korean Patent Application No. 10-2012-0119159 filed in the Korean Intellectual Property Office on Oct. 25, 2012, the entire content of which is incorporated herein by reference.

BACKGROUND

1. Field

The described technology relates generally to a two side display device and a manufacturing method thereof.

2. Description of the Related Art

A display device may include a liquid crystal display (LCD) or an organic light emitting diode (OLED) display capable of displaying an image on one surface of the display device. A two side display device is capable of displaying an image on two surfaces of the display device.

Two side display devices using an LCD may be made by positioning two display modules back-to-back, with each of the two display modules including a display panel, a backlight unit (BLU), and a driving chip (driver IC). Alternatively, a two side display device may include one BLU capable of emitting light in two directions to reduce the overall thickness of the two side display device. Further, a two side display device may include one BLU capable of emitting light in two directions and one driver IC, shared by two display panels that are connected by a flexible printed circuit (FPC).

However, two side display devices with two display panels are difficult to realize a thin thickness, and the process for attaching two display panels together increases manufacturing costs.

The above information disclosed in this Background section is only for enhancement of understanding of the background of the described technology and therefore it may contain information that does not form the prior art that is already known in this country to a person of ordinary skill in the art.

SUMMARY

Exemplary embodiments according to the present invention provide a two side display device with a thin thickness and a low manufacturing cost and a manufacturing method thereof.

A two side display device according to an exemplary embodiment includes: a flexible substrate including a first substrate part, a second substrate part under the first substrate part, and a bending part coupling the first substrate part to the second substrate part; a first display panel on the first substrate part and configured to display a first image in a first direction; a second display panel under the second substrate part and configured to display a second image in a second direction opposite the first direction; and a driving chip coupled to the first substrate part.

An adhesion member may be between the first substrate part and the second substrate part.

The driving chip may be formed as a chip on film.

The first substrate part may include a first image display part and a first scan driver configured to transmit a first scan signal to the first image display part, the second substrate part may include a second image display part and a second scan driver configured to transmit a second scan signal to the second image display part, a the first scan driver may be coupled to the driving chip through a first scan connection line, and the second scan driver may be coupled to the first scan driver through a second scan connection line.

The driving chip may transmit a first scan driver start signal to the first scan driver and a second scan driver start signal to the second scan driver.

The first image display part and the second image display part may be coupled by a bending data line formed at the bending part.

A first light emission control driver may be configured to transmit a first light emission control signal to the first image display part, a second light emission control driver may be configured to transmit a second light emission control signal to the second image display part, and the first light emission control driver may be coupled to the driving chip through a first light emission control connection line, and the second light emission control driver may be coupled to the first light emission control driver through a second light emission control connection line.

The driving chip may be configured to transmit a first light emission control driver start signal to the first light emission control driver and a second light emission control driver start signal to the second light emission control driver.

A demux circuit may be between the driving chip and the first image display part.

The driving chip may be directly on the first substrate part.

A demux circuit may be between the driving chip and the first image display part.

A manufacturing method of a two side display device according to another exemplary embodiment includes: forming a first display panel and a second display panel at a first substrate part and a second substrate part, respectively, of a flexible substrate; coupling a driving chip to the first substrate part; and bending a bending part between the first substrate part and the second substrate part of the flexible substrate to position the second substrate part under the first substrate part.

The method may further include adhering the first substrate part and the second substrate part by an adhesion member.

The two side display device may include a first scan driver configured to transmit a first scan signal to the first image display part of the first substrate part, and a second scan driver configured to transmit a second scan signal to the second image display part of the second substrate part, wherein the first scan driver is coupled to the driving chip through a first scan connection line and the second scan driver is coupled to the first scan driver through a second scan connection line.

According to exemplary embodiments, the first display panel and the second display panel are on the same surface of a flexible substrate and configured to display images in opposing directions by bending the flexible substrate at a bending part of the flexible substrate, which may reduce the thickness and manufacturing cost of the two side display device.

DETAILED DESCRIPTION

Figure 1:
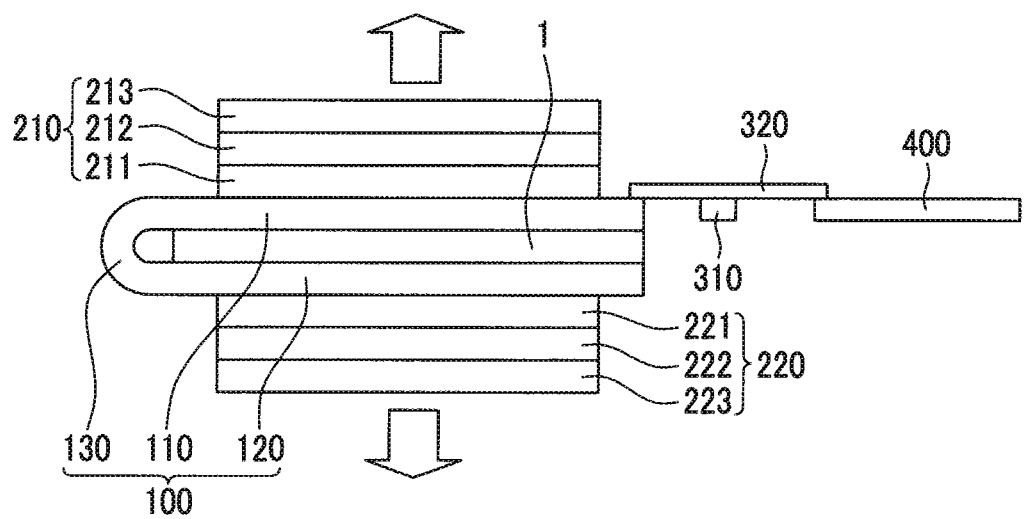
FIG. 1 is a schematic cross-sectional view of a two side display device according to the first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification. The size and thickness of each component shown in the drawings may have been exaggerated for clarity, understanding, and ease of description, but the present invention is not limited thereto.

Through the specification, it will be understood that when an element such as a layer, film, region, or substrate is referred to as being "on" another element, it can be directly on the other element or intervening elements may also be present.

Figure 2:
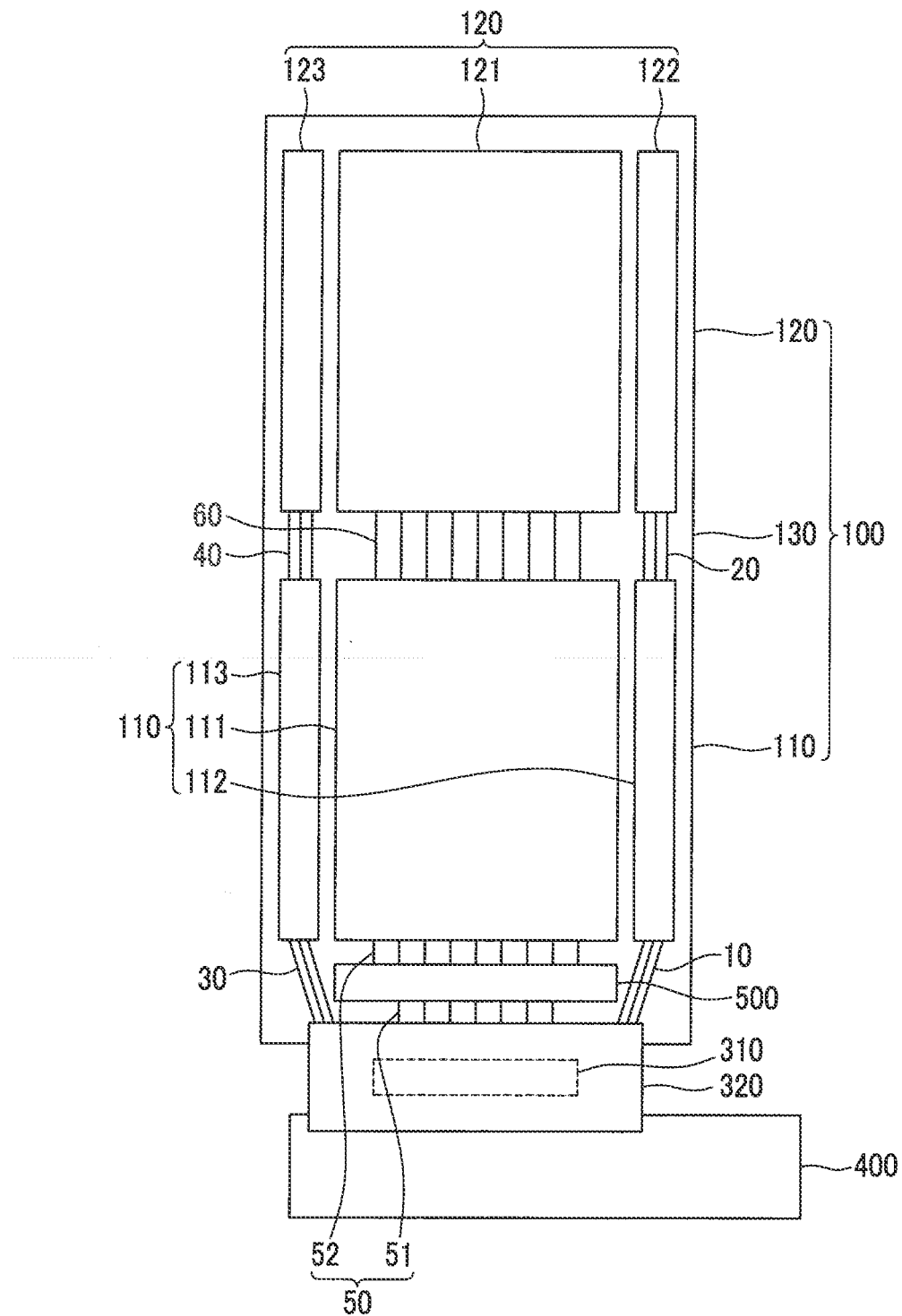
FIG. 2 is a schematic top plan view of a bending part of a two side display device according to the first exemplary embodiment before a bending.

FIG. 1 is a schematic cross-sectional view of a two side display device according to the first exemplary embodiment, and FIG. 2 is a schematic top plan view of a bending part of a two side display device according to the first exemplary embodiment before a bending.

As shown in FIG. 1, a two side display device according to the first exemplary embodiment includes a flexible substrate 100 including a first substrate part 110, a second substrate part 120 located (e.g. formed or positioned) under the first substrate part 110, and a bending part 130 that is bent (e.g., curved or bowed) for connecting the first substrate part 110 to the second substrate part 120. A first display panel 210 is positioned on the first substrate part 110 and is configured to display an image upward (i.e., in a direction away from the flexible substrate 100). A second display panel 220 is positioned under the second substrate part 120 and is configured to display an image downward (i.e., in a direction away from the flexible substrate 100). A driving chip 310 is positioned on a film 320 and connected to the first substrate part 110. The chip 310 and the film 320 constitute a chip on film 300 (e.g., see FIG. 3).

The first substrate part 110, the bending part 130, and the second substrate part 120 are continuously connected (e.g., formed as a single sheet or layer of material) thereby forming the flexible substrate 100.

An adhesion member 1 is formed between the first substrate part 110 and the second substrate part 120 thereby adhering the first substrate part 110 and the second substrate part 120 to each other.

The first display panel 210 includes a first light emitting element 211, a first encapsulation substrate 212 covering (e.g., encapsulating) the first light emitting element 211, and a first polarizing plate 213 formed on the first encapsulation substrate 212 and improving outer visibility.

Also, the second display panel 220 includes a second light emitting element 221, a second encapsulation substrate 222 covering (e.g., encapsulating) the second light emitting element 221, and a second polarizing plate 223 attached to the second encapsulation substrate 222 and improving outer visibility.

The driving chip 310 is formed on a film 320, and a flexible printed circuit (FPC) 400 is connected to the film 320, which is an anisotropic conductive film (ACF).

As described above, in the two side display device according to an exemplary embodiment, the first display panel 210 and the second display panel 220 are both (e.g., simultaneously) positioned on the same surface (or same side) of a single flexible substrate 100 and the second display panel 220 is positioned under the first display panel 210 by bending the bending part 130 of the flexible substrate 100 such that the thickness of the two side display device is thin and the manufacturing process of the two side display device is simplified thereby reducing the manufacturing cost.

As shown in FIG. 2, the first substrate part 110 includes a first image display part 111 including a plurality of light emitting elements connected between scan lines and data lines in a matrix method to form a plurality of pixels, a first scan driver 112 transmitting the first scan signal SCAN1 to the first image display part 111, and a first light emission control driver 113 transmitting the first light emission control signal to the first image display part 111. The first scan driver 112 and the first light emission control driver 113 process signals provided from the outside to generate the first scan signal SCAN1 and the first light emission control signal EM1, and are formed in the manufacturing process of the light emitting element or are formed of an additional driving chip 310, and are mounted on the first substrate part 110. The driver formed in the first substrate part 110 is not limited to the first scan driver 112 and the first light emission control driver 113, and the first light emission control driver 113 may be formed externally with respect to the first substrate part 110.

The second substrate part 120 includes a second image display part 121, a second scan driver 122 transmitting the second scan signal SCAN2 to the second image display part 121, and a second light emission control driver 123 transmitting the second light emission control signal EM2 to the second image display part 121. The second scan driver 122 and the second light emission control driver 123 process signals provided from the outside to generate the second scan signal SCAN2 and the second light emission control signal EM2 and are formed in the manufacturing process of the light emitting element or are formed of an additional driving chip 310, and are mounted on the first substrate part 120. The driver formed in the second substrate part 120 is not limited to the second scan driver 122 and the second light emission control driver 123, and the second light emission control driver 123 may be formed externally with respect to the second substrate part 120.

The first scan signal SCAN1 is a signal for switching to transmit the data signal DAT to the first image display part 111, the first light emission control signal EMI is a signal for controlling light emitted from the first image display part 111, the second scan signal SCAN2 is a signal for switching to transmit the data signal DAT to the second image display part 121, and the second light emission control signal EM2 is a signal for controlling the light emitted from the second image display part 121.

The first scan driver 112 is connected to the driving chip 310 through a first scan connection line 10, and the first light emission control driver 113 is connected to the driving chip 310 through a first light emission control connection line 30. Also, the second scan driver 122 is connected to the first scan driver 112 through a second scan connection line 20, and the second scan driver 122 is again connected to the driving chip 310 through the first scan driver 112 and the first scan connection line 10. Further, the second light emission control driver 123 is connected to the first light emission control driver 113 through a second light emission control connection line 40, and the second light emission control driver 123 is again connected to the driving chip 310 through the first light emission control driver 113 and the first light emission control connection line 30. The second scan driver 122 or the second light emission control driver 123 may be directly connected to the driving chip 310 through an additional signal line.

The second scan connection line 20 and the second light emission control connection line 40 are formed at the bending part 130.

The first image display part 111 and the second image display part 121 are connected by the bending data line 60 formed at the bending part 130. The data signal DAT generated in the driving chip 310 is transmitted to the first image display part 111 through a driving data line 50, and the data signal DAT passing through the second image display part 121 is transmitted to the second image display part 121 through a bending data line 60.

A demux circuit 500 increasing a channel of the driving chip 310 is formed between the driving chip 310 and the first image display part 111. The driving data line 50 includes a demux input terminal 51 connecting the channel of the driving chip 310 and the demux circuit 500 and a demux output terminal 52 connecting the first image display part 111 and the demux circuit 500. A number of demux output terminals 52 is greater than a number of demux input terminals 51.

The driving chip 310 independently transmits the first scan driver start signal FLM1 to the first scan driver 112, and the second scan driver start signal FLM2 to the second scan driver 122 to independently control the operation of the two scan drivers.

Also, the driving chip 310 independently transmits the first light emission control driver start signal EM_FLM1 to the first light emission control driver 113, and the second light emission control driver start signal EM_FLM2 to the second light emission control driver 123, to independently control the operation of the two light emission control drivers.

Accordingly, the driving chip 310 may independently control the driving of the first display panel 210 and the second display panel 220. Accordingly, the first display panel 210 and the second display panel 220 may independently or simultaneously display the image.

For example, when the first display panel 210 displays the image, the first scan driver start signal and the first light emission control driver start signal EM_FLM1 are operated, but the second scan driver start signal and the second light emission control driver start signal EM_FLM2 are not operated such that the first display panel 210 displays the image and the second display panel 220 does not display the image.

Alternatively, when the second display panel 220 displays the image, the second scan driver start signal and the second light emission control driver start signal EM_FLM2 are operated, but the first scan driver start signal and the first light emission control driver start signal EM_FLM1 are not operated such that the second display panel 220 displays the image and the first display panel 210 does not display the image.

Alternatively, the first display panel 210 and the second display panel 220 may both display the same image concurrently (e.g., simultaneously) or sequentially, such that the first scan driver start signal and the first light emission control driver start signal EM_FLM1, and the second scan driver start signal and the second light emission control driver start signal EM_FLM2, are operated such that the first display panel 210 and the second display panel 220 concurrently (e.g., simultaneously) display the image or sequentially display the image.

Next, a manufacturing method of the two side display device according to the first exemplary embodiment will be described with reference to FIG. 1 through FIG. 3.

Figure 3:
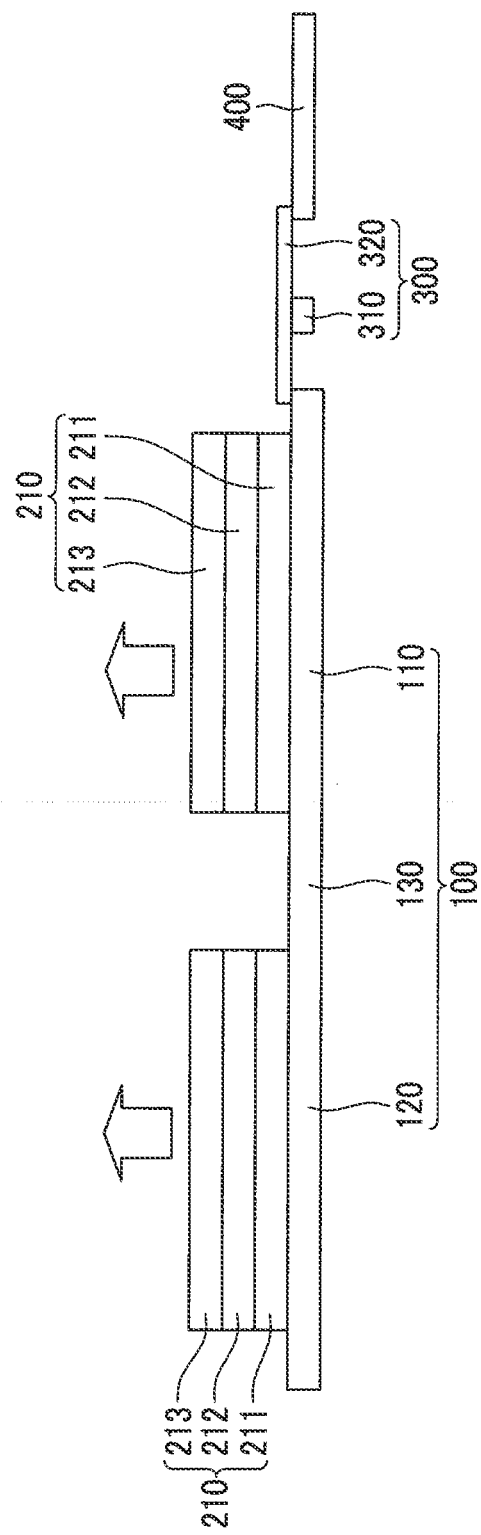
FIG. 3 is a schematic cross-sectional view of a manufacturing method of a two side display device according to the first exemplary embodiment.

FIG. 3 is a schematic cross-sectional view of a manufacturing method of a two side display device according to the first exemplary embodiment.

Firstly, as shown in FIG. 2 and FIG. 3, the first display panel 210 and the second display panel 220 are respectively formed over the first substrate part 110 and the second substrate part 120 of the flexible substrate 100.

Also, the film 320, including the driving chip 310 mounted over the film 320, is connected to the first substrate part 110. As shown in FIG. 2, the first scan driver 112 is connected to the driving chip 310 through the first scan connection line 10, and the second scan driver 122 is connected to the first scan driver 112 through the second scan connection line 20. The first light emission control driver 113 is connected to the driving chip 310 through the first light emission control connection line 30, and the second light emission control driver 123 is connected to the first light emission control driver 113 through the second light emission control connection line 40.

Next, as shown in FIG. 1, the bending part 130 is bent between the first substrate part 110 of the flexible substrate 100 and the second substrate part 120 for the second substrate part 120 to be positioned under the first substrate part 110.

Also, the first substrate part 110 and the second substrate part 120 are adhered by the adhesion member 1.

As described above, in the manufacturing method of the two side display device according to an exemplary embodiment, the first display panel 210 and the second display panel 220 are both formed on the same surface (or same side) of a single flexible substrate 100 and the second display panel 220 is positioned under the first display panel 210 by bending the bending part 130 of the flexible substrate 100 such that the thickness of the two side display device is thin and the manufacturing process of the two side display device is simplified thereby reducing the manufacturing cost.

Meanwhile, in the first exemplary embodiment, the demux circuit is formed, however a second exemplary embodiment without the demux circuit is possible.

Figure 4:
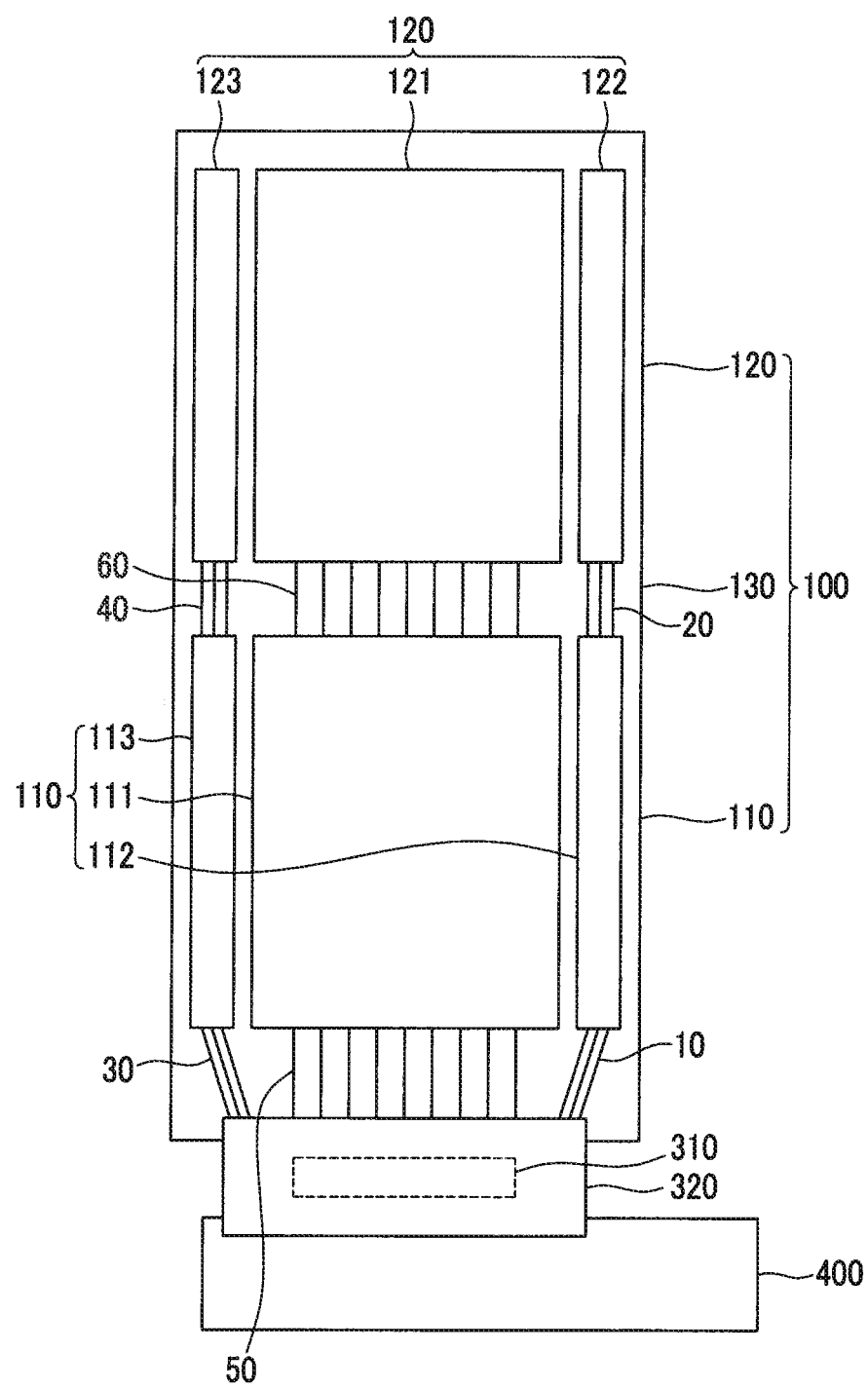
FIG. 4 is a schematic top plan view of a bending part of a two side display device according to the second exemplary embodiment before a bending.

FIG. 4 is a top plan view of a bending part of a two side display device according to the second exemplary embodiment before bending.

As shown in FIG. 4, the data signal DAT generate in the driving chip 310 of the two side display device according to the second exemplary embodiment is transmitted to the first image display part 111 through the driving data line 50, and the data signal DAT passing through the second image display part 121 is transmitted to the second image display part 121 through the bending data line 60. In the two side display device of high resolution, the driving chip 310 has a sufficient number of channels such that the separate demux circuit 500 is not necessary.

Meanwhile, the driving chip 310 is mounted on the chip on film in the first exemplary embodiment, however a third exemplary embodiment of a structure of a chip on glass in which the driving chip 310 is directly mounted on the first substrate part is possible.

Next, the third exemplary embodiment will be described with reference to FIG. 5 and FIG. 6.

Figure 5:
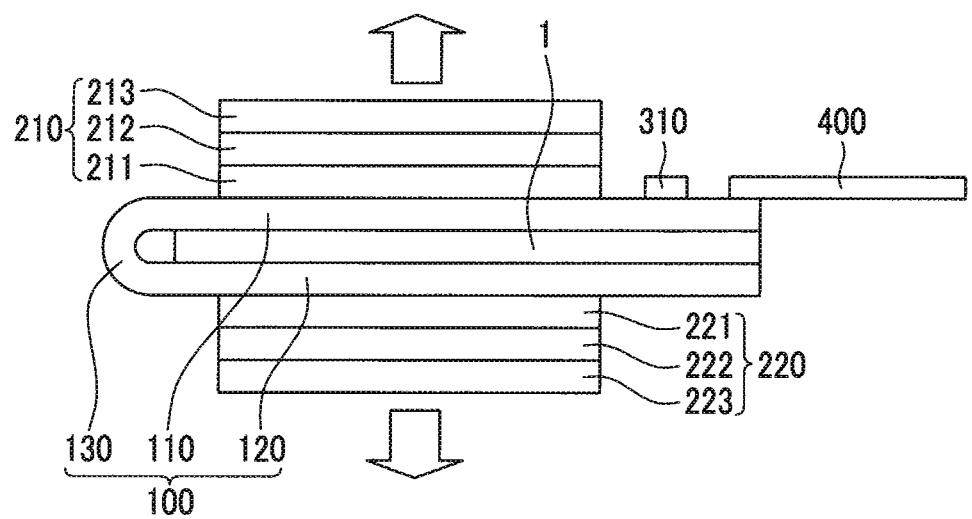
FIG. 5 is a schematic cross-sectional view of a two side display device according to the third exemplary embodiment.
Figure 6:
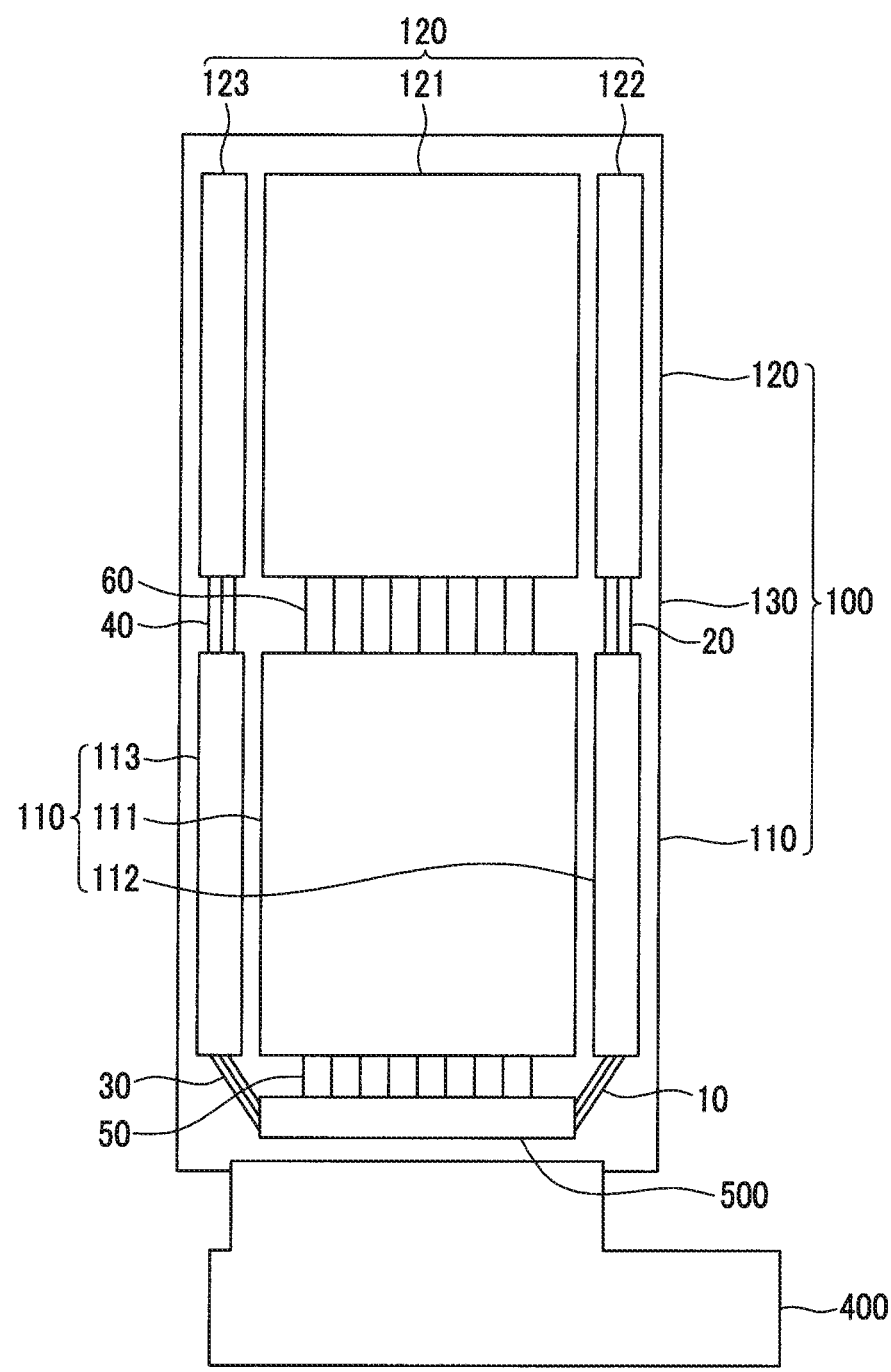
FIG. 6 is a schematic top plan view of a bending part of a two side display device according to the third exemplary embodiment before a bending.

FIG. 5 is a schematic cross-sectional view of a two side display device according to the third exemplary embodiment, and FIG. 6 is a schematic top plan view of a bending part of a two side display device according to the third exemplary embodiment before a bending.

The third exemplary embodiment shown in FIG. 5 and FIG. 6 is similar to the first exemplary embodiment shown in FIG. 1 to FIG. 3 except for the chip on glass such that the repeated description is omitted.

As shown in FIG. 5 and FIG. 6, in the two side display device according to the third exemplary embodiment, the driving chip 310 is directly mounted on the first substrate part 110. Accordingly, the separate film 320 is not necessary such that the structural area occupied by the film 320 may be omitted, thereby reducing the thickness and the volume of the two side display device.

Meanwhile, the demux circuit 500 is formed in the third exemplary embodiment, as shown in FIG. 6. However a fourth exemplary embodiment without the demux circuit is possible.

Figure 7:
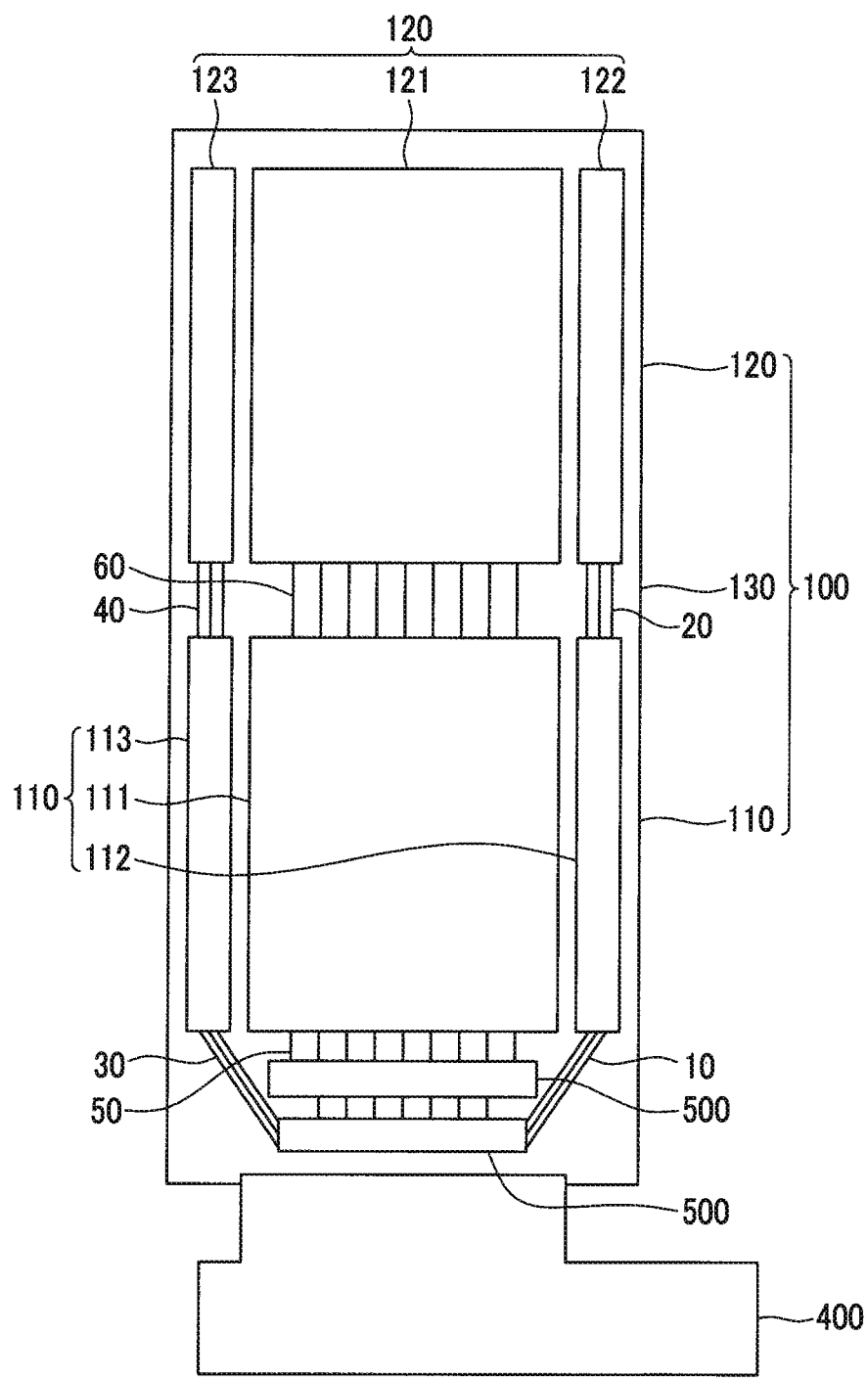
FIG. 7 is a schematic top plan view of a bending part of a two side display device according to the fourth exemplary embodiment before a bending.

FIG. 7 is a schematic top plan view of a bending part of a two side display device according to the fourth exemplary embodiment before bending.

As shown in FIG. 7, the data signal DAT generated in the driving chip 310 that is directly mounted at the first substrate part 110 of the two side display device according to the fourth exemplary embodiment is transmitted to the first image display part 111 through the driving data line 50, and the data signal DAT passing through the second image display part 121 is transmitted to the second image display part 121 through the bending data line 60. The driving chip 310, which includes a large number of channels, is used in the two side display device of the high resolution such that the separate demux circuit is not necessary.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| | |
|---|---|
| 100: flexible substrate | 110: first substrate part |
| 120: second substrate part | 130: bending part |
| 210: first display panel | 220: second display panel |
| 300: chip on film | 310: driving chip |
| 320: film | 400: flexible printed circuit (FPC) |

What is claimed is:

1. A two side display device, comprising:
a flexible substrate formed as a single sheet of material comprising:
a first substrate part;
a second substrate part under the first substrate part; and
a bending part coupling the first substrate part to the second substrate part;
an adhesion member between the first substrate part and the second substrate part,
the adhesion member adhering the first substrate part and the second substrate part to each other when the bending part is bent;
a first display panel on the first substrate part and configured to display a first image in a first direction;
a second display panel under the second substrate part and configured to display a second image in a second direction opposite the first direction; and
a driving chip coupled to the first substrate part.

2. The two side display device of claim 1, wherein the driving chip is formed as a chip on film.

3. The two side display device of claim 2, wherein the first substrate part comprises a first image display part and a first scan driver configured to transmit a first scan signal to the first image display part,
the second substrate part comprises a second image display part and a second scan driver configured to transmit a second scan signal to the second image display part, and
the first scan driver is coupled to the driving chip through a first scan connection line, and the second scan driver is coupled to the first scan driver through a second scan connection line.

4. The two side display device of claim 3, wherein the driving chip transmits a first scan driver start signal to the first scan driver and a second scan driver start signal to the second scan driver.

5. The two side display device of claim 4, wherein the first image display part and the second image display part are coupled by a bending data line formed at the bending part.

6. The two side display device of claim 3, further comprising:
a first light emission control driver configured to transmit a first light emission control signal to the first image display part,
a second light emission control driver configured to transmit a second light emission control signal to the second image display part, and
the first light emission control driver is coupled to the driving chip through a first light emission control connection line, and the second light emission control driver is coupled to the first light emission control driver through a second light emission control connection line.

7. The two side display device of claim 6, wherein the driving chip is configured to transmit a first light emission control driver start signal to the first light emission control driver and a second light emission control driver start signal to the second light emission control driver.

8. The two side display device of claim 3, further comprising a demux circuit between the driving chip and the first image display part.

9. The two side display device of claim 1, wherein the driving chip is directly on the first substrate part.

10. The two side display device of claim 9, further comprising a demux circuit between the driving chip and a first image display part.

11. A method of manufacturing a two side display device, comprising:
forming a first display panel and a second display panel at a first substrate part and a second substrate part, respectively, of a flexible substrate formed as a single sheet of material;
coupling a driving chip to the first substrate part;
forming an adhesion member between the first substrate part and the second substrate part; and
bending a bending part between the first substrate part and the second substrate part of the flexible substrate to position the second substrate part under the first substrate part, the adhesion member adhering the first substrate part and the second substrate part to each other when the bending part is bent.

12. The method of claim 11, wherein the two side display device comprises:
a first scan driver configured to transmit a first scan signal to a first image display part of the first substrate part; and a second scan driver configured to transmit a second scan signal to a second image display part of the second substrate part, wherein the first scan driver is coupled to the driving chip through a first scan connection line and the second scan driver is coupled to the first scan driver through a second scan connection line.

* * * * *